United States Patent [19]

Isberg et al.

[11] Patent Number: 5,998,085

[45] Date of Patent: Dec. 7, 1999

[54] PROCESS FOR PREPARING HIGH RESOLUTION EMISSIVE ARRAYS AND CORRESPONDING ARTICLES

[75] Inventors: Thomas A. Isberg, Apple Valley; Claire A. Jalbert, Cottage Grove; John S. Staral, Woodbury; William A. Tolbert, Woodbury; Martin B. Wolk, Woodbury, all of Minn.

[73] Assignee: 3M Innovative Properties, St. Paul, Minn.

[21] Appl. No.: 08/881,922

[22] Filed: Jun. 25, 1997

Related U.S. Application Data

[63] Continuation of application No. 08/685,161, Jul. 23, 1996, abandoned.

[51] Int. Cl.$^6$ ...................................................... G03F 7/34
[52] U.S. Cl. ..................... 430/200; 430/201; 430/945; 430/25; 430/26; 427/555; 427/68; 156/234; 156/235
[58] Field of Search ................................ 313/461, 469, 313/495; 426/555, 68, 71; 430/945, 200, 201, 26, 25; 156/234, 235

[56] References Cited

U.S. PATENT DOCUMENTS

| | | |
|---|---|---|
| 3,795,814 | 3/1974 | Rabatin .................................. 250/460 |
| 3,859,527 | 1/1975 | Luckey ................................... 250/327 |
| 3,883,747 | 5/1975 | Murashige et al. ..................... 250/483 |
| 3,974,389 | 8/1976 | Ferri et al. ............................. 250/483 |
| 4,204,125 | 5/1980 | Fatuzzo et al. ........................ 250/486 |
| 4,225,653 | 9/1980 | Brixner .................................. 428/539 |
| 4,249,011 | 2/1981 | Wendling ............................... 548/312 |
| 4,252,671 | 2/1981 | Smith .................................... 252/430 |
| 4,258,264 | 3/1981 | Kotera et al. .......................... 250/484 |
| 4,261,854 | 4/1981 | Kotera et al. .................... 252/301.4 H |
| 4,262,072 | 4/1981 | Wendling et al. ....................... 430/14 |
| 4,387,141 | 6/1983 | Patten ................................... 428/690 |
| 4,405,691 | 9/1983 | Yale ...................................... 428/690 |
| 4,598,207 | 7/1986 | Naruse et al. ....................... 250/484.1 |
| 4,599,298 | 7/1986 | Fisch ..................................... 430/271 |
| 4,652,462 | 3/1987 | Nishizawa et al. .................... 427/555 |
| 4,772,583 | 9/1988 | Sprecker et al. ........................ 512/12 |
| 4,822,643 | 4/1989 | Chou et al. ............................ 427/256 |
| 4,833,124 | 5/1989 | Lum ...................................... 503/227 |
| 4,839,224 | 6/1989 | Chou et al. ............................ 428/323 |
| 4,912,083 | 3/1990 | Chapman et al. ...................... 503/227 |
| 4,940,640 | 7/1990 | MacDiarmid .......................... 429/213 |
| 4,942,141 | 7/1990 | DeBoer et al. ......................... 503/227 |
| 4,948,776 | 8/1990 | Evans et al. ........................... 503/227 |
| 4,948,777 | 8/1990 | Evans et al. ........................... 503/227 |
| 4,948,778 | 8/1990 | DeBoer ................................. 503/227 |
| 4,950,639 | 8/1990 | DeBoer et al. ......................... 503/227 |
| 4,952,552 | 8/1990 | Chapman et al. ...................... 503/227 |
| 4,973,572 | 11/1990 | DeBoer ................................. 503/227 |
| 5,023,229 | 6/1991 | Evans et al. ........................... 503/227 |
| 5,024,990 | 6/1991 | Chapman et al. ...................... 503/227 |
| 5,089,372 | 2/1992 | Kirihata et al. ........................ 430/167 |

(List continued on next page.)

FOREIGN PATENT DOCUMENTS

| | | |
|---|---|---|
| 175 578 | 3/1986 | European Pat. Off. ......... G21K 4/00 |
| 568 993 | 11/1993 | European Pat. Off. ........ G03F 7/004 |
| 0 641 008 A1 | 3/1995 | European Pat. Off. ......... H01J 9/227 |
| 146447 | 11/1980 | Japan ........................... G03C 005/17 |
| 55-163500 | 12/1980 | Japan ........................... G03C 005/17 |
| 59-020466 | 2/1984 | Japan .............................. B01J 19/00 |
| 62-67416A | 3/1987 | Japan ............................ G01H 005/00 |
| 62-95670A | 5/1987 | Japan ............................. G06F 15/66 |
| 63-60793 | 3/1988 | Japan . |
| 63-089385 | 4/1988 | Japan .............................. B41M 5/26 |
| 64-14081 | 1/1989 | Japan .............................. B41M 5/26 |
| 63-02270A | 7/1989 | Japan ........................... B41M 005/18 |
| 2 083 726 | 3/1982 | United Kingdom ............. H04N 1/22 |
| WO 94/22674 | 10/1994 | WIPO . |
| WO 95/13195 | 5/1995 | WIPO . |
| WO 96/02010 | 1/1996 | WIPO . |

OTHER PUBLICATIONS

Bello, K.A. et al, "Near–infrared–absorbing Squaraine Dyes containing 2,3–Dihydroperimidine Terminal Groups," *J. Chem. Socl, Chem–Commun.*, p. 452–4 (1993).

Chuang, T.J. et al., "Laser–Photoetching Characteristics of Polymers with Dopants," *Appl. Phys. A*, 45, p. 277–288 (1988).

Hase, T., et al., "Phosphor Materials for Cathode–Ray Tubes," *Advances in Electronic and Electron Physics*, Academic Press, Inc., New York, 79, 271 (1990).

Oki, K., et al., "A Phosphor Screen for High–Resolution CRTs," *Journal of the SID*, vol. 3, No. 51 (1995).

Raue, R., et al., "Phosphor Screens in Cathode–Ray Tubes for Projection Television," *Philips Tech. Rev.*, vol. 44, No. 11/12, p. 335–347 (Nov. 1989).

"Luminescent Materials," *Ullmann's Encyclopedia of Industrial Chemistry*, 5th Ed., vol. A15, p. 539–554 (1990).

M. Irie et al., "Thermal Transfer Color Printing Using Laser Heating", *Journal of Imaging Science and Technology*, 37, 235–238 (May/Jun. 1993).

*Primary Examiner*—Martin Angebranndt
*Attorney, Agent, or Firm*—William D. Miller; Robert J. Pechman

[57] ABSTRACT

A process is described for forming an emissive or phosphor screen. The process comprises the steps of:

a) providing a thermal mass donor element comprising a substrate with a front side and a back side, with a coating of emissive material or phosphor adhered to said front side of said substrate, b) placing said coating of emissive material or phosphor adjacent to a support layer, c) addressing said mass donor element with coherent radiation to heat at least a portion of said coating of emissive material or phosphor to locally transfer at least some of said emissive material or phosphor to said support layer, d) repeating step c) a sufficient number of times to provide a coating of transferred emissive material or phosphor on said support layer in an area of at least 1 square centimeter.

21 Claims, No Drawings

U.S. PATENT DOCUMENTS

| | | | |
|---|---|---|---|
| 5,124,564 | 6/1992 | Fouassier et al. | 250/484.1 |
| 5,156,938 | 10/1992 | Foley et al. | 430/200 |
| 5,164,224 | 11/1992 | Kojima et al. | 427/65 |
| 5,166,024 | 11/1992 | Bugner et al. | 430/70 |
| 5,171,650 | 12/1992 | Ellis et al. | 430/20 |
| 5,278,023 | 1/1994 | Bills et al. | 430/201 |
| 5,286,604 | 2/1994 | Simmons, III | 430/286 |
| 5,296,117 | 3/1994 | De Jaeger et al. | 204/181.5 |
| 5,302,423 | 4/1994 | Tran et al. | 427/555 |
| 5,306,637 | 4/1994 | Lin et al. | 435/259 |
| 5,308,737 | 5/1994 | Bills et al. | 430/201 |
| 5,340,699 | 8/1994 | Haley et al. | 430/302 |
| 5,351,617 | 10/1994 | Williams et al. | 101/467 |
| 5,360,694 | 11/1994 | Thien et al. | 430/200 |
| 5,401,607 | 3/1995 | Takiff et al. | 430/253 |
| 5,501,937 | 3/1996 | Matsumoto et al. | 430/201 |
| 5,707,745 | 1/1998 | Forrest et al. | 428/432 |
| 5,725,989 | 3/1998 | Chang et al. | 430/201 |

PROCESS FOR PREPARING HIGH RESOLUTION EMISSIVE ARRAYS AND CORRESPONDING ARTICLES

This is a continuation of application No. 08/685,161 filed Jul. 23, 1996, now abandoned.

BACKGROUND OF THE INVENTION

1. Field of the Invention

The present invention relates to thermal transfer elements and imaging radiation addressed (e.g., laser addressed) thermal mass transfer processes for use in the manufacture of high resolution emissive arrays. More particularly the invention relates to the use of radiation addressable thermal transfer elements having emissive materials such as phosphors in the transfer layer.

2. Background of the Art

Historically, phosphor arrays have been used in a variety of products including televisions, personal computer (PC) monitors, medical devices, oscilloscopes, radar tubes, optoelectronic image converters, personal safety products, bar coding, medical imaging screens (intensifying or storage phosphor screens), etc. Emissive arrays and phosphor display technology is expanding with the introduction of emissive flat panel display devices such as field emission displays (FEDs), electroluminescent displays (ELs), plasma displays (PDPs), vacuum fluorescent displays (VFD's), etc. A review of emissive display technology is provided in the Society for Information Display's publication Fundamentals of Emissive Technology by C. Curtin and C. Infante. As emissive display technology spreads into related product areas, the market continues to demand higher quality and higher resolution products. For example, miniaturized display devices for use in televisions, PC's, and camcorder viewfinders require a resolution of more than 50 lines/mm. (Oki, K. and L. Ozawa, "A Phosphor Screen for High-Resolution CRTs," *Journal of the SID,* 3, 51, 1995). For high-definition projection televisions having large picture formats, the requirements for the diameter of the electron spot is about a tenth of the diameter of the spot in present direct-view cathode ray tube screens and the maximum energy excitation density (approximately 2 W/cm$^2$) is about a hundred times higher. (Raue, R., A. T. Vink and T. Welker, *Philips Tech. Rev.,* 44, 335, 1989). These performance standards are very difficult to achieve with the current phosphor screen methods of manufacture, even though the phosphors available have the theoretic capability of providing these characteristics.

Phosphors are a critical component of cathode-ray tubes (CRTs), field electroluminescence devices (commonly referred to as EL devices), plasma display panels (PDP), light emitting diodes (LEDs), and field-emitting displays (FEDs).

In CRTs the quality of the screen image is dependent upon the cathodoluminescent efficiency and resolution of the phosphor screen. Many methods exist for the production of phosphor screens. A review of the various methods and their applications is described in Hase, T., T. Kano, E. Nakazawa, and H. Yamamoto, "Phosphor Materials for Cathode-Ray Tubes," *Advances in Electronic and Electron Physics,* Academic Press, Inc., New York, 79, 271 (1990).

Traditionally, the sedimentation process has been and still is the predominant process for depositing phosphors onto screens for monochrome CRTs. In this process, a suspension of the phosphor in alcohol or water, with the addition of an aqueous silicate solution, is placed in the glass envelope or bulb of the CRT and is allowed to deposit onto the inner surface of the faceplate through sedimentation. The phosphor forms a layer whose adhesion, both to itself and to the glass, is effected by the slowly precipitating silicic acid. The coagulation time of the aqueous silicate is adapted to the sedimentation rate of the phosphor by addition of electrolytes. The resultant screen has a relatively rough surface having phosphor particles that are loosely packed due to the coagulation process. Even though the loosely packed phosphor screen may have a somewhat higher cathodoluminescent efficiently than screens having more closely packed phosphors, the resolution of the loosely packed screens is lower. Another disadvantage of this method is that it requires relatively thick (approximately 6 mg/cm$^2$) screens to insure a pinhole free coating, which thickness also decreases the resolution capability of the screen.

A slurry method is typically used in the production of shadow mask and aperture grill color CRTs where the screen consists of an array of multicolored dots or stripes. In this process, a slurry of a single color phosphor in a photosensitive resin is initially spin-coated onto the glass panel as a continuous layer. The coating is exposed to ultraviolet (UV) radiation from a point source through the apertures of a shadow mask, thus rendering the exposed areas insoluble in water. The non-exposed areas are removed by washing with water to form a phosphor image on the glass panel. This imaging process is then repeated at least two more times using phosphors of different colors to generate green, blue and red phosphor patterns. A dusting method is also sometimes employed to manufacture multicolored shadow mask CRTs. In the dusting method, the same basic process is used as described above except that dry phosphor is dusted onto the wet photosensitive coating prior to imaging. Exposure of the screen by UV radiation through shadow mask apertures immobilizes the phosphor coating in the irradiated areas. This process is then repeated until all three colored phosphor patterns are formed on the glass panel. The primary concerns with these methods is the trade-off between pinhole formation and contamination by other color phosphors in the wash-off step. If a strong rinse is used, pinholes may form and if a weak rinse is used, the color phosphors may not be completely washed away in the non-exposed areas. An alternative dusting method uses a phototackifiable resist. In this method, the photosensitive layer is exposed with UV radiation prior to depositing the phosphor. The phosphor adhere to only the tackified image areas. Again, the primary concern with this method is contamination by other color phosphors.

For applications requiring highly dense monochromatic phosphor screens with small particles, a deposition method is typically used. In this process, the phosphor powders are suspended in a polar organic solvent and cationic additives are adsorbed onto the surface of the phosphor. A negative potential is applied to a conductive substrate immersed in the solution with respect to a negative electrode held parallel to the substrate. The resulting applied electric field causes the positively charged phosphor particles to migrate to the substrate, thus coating the surface.

One such application requiring a high density phosphor screen is medical X-ray imaging. These screens usually comprise phosphors in a binder on a carrier layer. The phosphors absorb X-ray radiation at a higher efficiency than does silver halide which is normally used in the hard-copy output of radiographic images. The phosphors not only absorb X-rays at an efficient rate, but can also phosphoresce, emitting radiation at a wavelength other than the wavelength of X-rays which the phosphor absorbed. Depending upon the chemical nature and properties of the phosphor, the emitted radiation may be at essentially any wavelength between and including the infrared and ultraviolet wavelengths of the electromagnetic spectrum. Silver halide naturally absorbs radiation in the ultraviolet and near blue wavelengths, and can be spectrally sensitized to efficiently absorb radiation in other portions of the ultraviolet, visible and the infrared regions of the electromagnetic spectrum. By exposing the phosphor screen to X-rays, having the phosphor screen emit in the UV, visible or infrared, and having a silver halide emulsion spectrally sensitized to the wavelength of emission of the phosphor screen and optically associated with the phosphor screen, the entire efficiency of the X-ray imaging system can be greatly enhanced. This allows for the use of lower doses of X-rays during exposure of the object.

The use of such phosphors is well known in the art as exemplified by such patents as U.S. Pat. Nos. 3,883,747 and 4,204,125 where there is direct emission of phosphorescent radiation upon X-ray stimulation, and U.S. Pat. Nos. 3,859,527 and 5,164,224 where there is exposure to X-rays, storage of the absorbed energy by the phosphor, and subsequent stimulation by stimulating radiation to cause the phosphor to emit the stored energy as UV to infrared radiation. These phosphor systems are commercially successful and provide a significant benefit to the radiographic art. In these types of systems, however, there is a trade-off between speed and sharpness. To absorb more X-rays and emit more light, the screen itself can be made thicker. But in this case, light generated within the thickness of the screen is scattered by the phosphor grains to a greater extent, thereby reducing the resulting image sharpness recorded on the film. Conversely, to improve sharpness a thinner screen is desirable, but this reduces the X-ray absorbing power, and ultimately requires a higher dosage to the patient or object being X-rayed.

Many methods of improving the image quality, particularly the sharpness of images generated from phosphor screens, without adversely affecting the sensitivity or speed of the system, have been proposed. Reflective particulates, dyes, pigments and other light affecting materials have been proposed as additives to phosphor layers to improve sharpness as shown in EPO 102 790 (powdered glass), Japanese Application 146,447/1980 (white pigments), Japanese Patent Application 16-3,500/1980 (colorants), and EPO 175 578 (sputtering or vacuum evaporation of phosphors).

The objective of these methods primarily is to provide a high concentration of phosphor in the active layer of the screen and provide a screen of uniform properties. U.S. Pat. No. 5,306,367 produces a storage phosphor screen by dispersing phosphor particles in a thermoplastic binder diluted with a solvent, then coats the mixture, dries to remove the solvent, and compresses the coating at a temperature above the melting point of the binder. U.S. Pat. No. 5,296,117 deposits phosphor particles in a binder by electrophoretic deposition of a dispersion of the phosphor particles in a solution of polymeric binder. The solution is coated onto a substrate, dried and the phosphor screen thus produced. Each of these types of systems has shown some benefits, but there is still significant room for improvement in the sharpness of radiographic phosphor screens. In particular, it is desired to eliminate complicated deposition processes which can be costly, to eliminate the use of solvents which are harmful to the environment, and to eliminate or reduce high processing temperatures.

Some attempts have been made to provide a method of transferring a phosphor image directly onto a glass panel using a thermal transfer tape, ribbon or sheet and a thermal head printer. Examples of this type of application are disclosed in Japanese Application Nos. 63-02270A; 62-67416A; and 84-020466B. The advantage of this type of method is the selective placement of the phosphor on the substrate. However, the use of thermal printer heads limits the composition, shape and configuration of substrate used, produces low resolution images limited by the size of the printhead, makes the registration of adjacent phosphors difficult to control, and reduces the through-put of manufactured materials because of the slow speed of printheads. For example, the substrate must be flat to achieve a uniform transfer of the image. In addition, thermal print heads are currently limited in size and face a practical limit in reducing the size of the printing head.

Japanese Patent Application No. 62-95670A describes a thermal transfer construction which uses a conductive film layer within the construction. The transfer element is imaged by means of electrodes installed over the element. This construction suffers the same limitation as the conventional thermal transfer elements in that the substrate must be flat to achieve uniform transfer of the image.

There is a need for an efficient dry process for forming an emissive material or phosphor image on a variety of substrate sizes and configuration. In addition, there is a need for materials that are capable of producing high resolution and large excitation density to meet the increasing demands in the manufacture of high-definition televisions, field emission displays, and other hybrid display techniques.

The increasing availability and use of higher output compact lasers, semi-conductor light sources, laser diodes and other radiation sources which emit in the ultraviolet, visible and particularly in the near-infrared and infrared regions of the electromagnetic spectrum, have allowed the use of these sources as viable alternatives for the thermal printhead as an energy source. The use of a radiation source such as a laser or laser diode as the imaging source is one of the primary and preferred means of transferring electronic information onto an image recording media. The use of radiation to expose the media provides higher resolution and more flexibility in format size of the final image than the traditional thermal printhead imaging systems. In addition, radiation sources such as lasers and laser diodes provide the advantage of eliminating the detrimental effects from contact of the media with the heat source. The size, shape, energy and duration of the spot dwell time may be readily controlled according to the needs of the particular process and materials used. Various thermal imaging materials and processes are shown in U.S. Pat. Nos. 5,171,650, 5,156,938, GB Patent Application 2 083 726 A and Japanese Kokai Patent Publication Sho 63[1988]-60793.

U.S. Pat. Nos. 5,171,650 and 5,156,938 disclose an information transferring system and process in which materials are propulsively transferred from a donor layer to a receptor layer. Amongst the many materials listed which could be transferred in this information transferring system are luminescent materials (U.S. Pat. No. 5,171,650, column 13, lines 8–23) and phosphors (e.g., U.S. Pat. No. 5,278,023). The phosphors are included within the broad class of materials which provide information density when transferred, and although described as the types of phosphors used for television or medical imaging purposes, are not transferred to coat an entire surface, but are to be distributed in an information bearing pattern.

U.S. Pat. No. 5,171,650 discloses methods and materials for thermal imaging using an "ablation-transfer" technique.

The donor element used in the imaging process comprises a support, an intermediate dynamic release layer, and an ablative carrier topcoat containing a colorant. Both the dynamic release layer and the color carrier layer may contain an infrared-absorbing (light-to-heat conversion) dye or pigment. A colored image is produced by placing the donor element in intimate contact with a receptor and then irradiating the donor with a coherent light source in an imagewise pattern. The colored carrier layer is simultaneously released and propelled away from the dynamic release layer in the light struck areas creating a colored image on the receptor.

European Patent No. EP 562,952 discloses ablative imaging elements comprising a substrate coated on a portion thereof with an energy sensitive layer comprising a glycidyl azide polymer in combination with a radiation absorber. Demonstrated imaging sources included infrared, visible, and ultraviolet lasers. Solid state lasers were disclosed as exposure sources, although laser diodes were not specifically mentioned. This application is primarily concerned with the formation of relief printing plates and lithographic plates by ablation of the energy sensitive layer. No specific mention of utility for thermal mass transfer was made.

U.S. Pat. No. 5,308,737 discloses the use of black metal layers on polymeric substrates with gas-producing polymer layers which generate relatively high volumes of gas when irradiated. The black metal (e.g., black aluminum) absorbs the radiation efficiently and converts it to heat for the gas-generating materials. It is observed in the examples that in some cases the black metal was eliminated from the substrate, leaving a positive image on the substrate.

U.S. Pat. No. 5,278,023 discloses laser-addressable thermal transfer materials for producing color proofs, printing plates, films, printed circuit boards, and other media. The materials contain a substrate coated thereon with a propellant layer wherein the propellant layer contains a material capable of producing nitrogen ($N_2$) gas at a temperature of preferably less than about 300° C.; a radiation absorber; and a thermal mass transfer material. The thermal mass transfer material may be incorporated into the propellant layer or in an additional layer coated onto the propellant layer. The radiation absorber may be employed in one of the above-disclosed layers or in a separate layer in order to achieve localized heating with an electromagnetic energy source, such as a laser. Upon laser induced heating, the transfer material is propelled to the receptor by the rapid expansion of gas. The thermal mass transfer material may contain, for example, pigments, toner particles, resins, metal particles, monomers, polymers, dyes, or combinations thereof. Also disclosed is a process for forming an image as well as an imaged article made thereby.

Laser-induced mass transfer processes have the advantage of very short heating times (nanoseconds to microseconds); whereas, the conventional thermal mass transfer methods are relatively slow due to the longer dwell times (milliseconds) required to heat the printhead and transfer the heat to the donor. The transferred images generated under laser-induced ablation imaging conditions are often fragmented (being propelled from the surface as particulates or fragments).

SUMMARY OF THE INVENTION

The present invention provides a process for preparing and selectively transferring emissive material in uniformity (i.e., even distribution or continuous distributions of particulates) to substrates using laser addressed thermal imaging techniques to produce a high resolution emissive screen and panel. Such screens and panels include cathode-ray tubes (CRTs), field emissions displays (FEDs), electroluminescent displays (ELs), plasma displays (PDPs), vacuum fluorescent displays (VFDs), X-ray intensifying screens, and the like. The present invention relates to an emissive thermal transfer element comprising a substrate having deposited thereon (a) an optional light-to-heat conversion layer, (b) an optional interlayer, (c) a thermal transfer layer comprising a coating of emissive material (e.g., phosphor, semiconductor electroluminescent materials, fluorescers, emissive organic polymers, etc.) and (d) optionally an adhesive coating, and to the method of transferring said emissive material to a substrate in a uniform distribution of said emissive material so that a panel having uniform emissions may be formed by the transfer process. By 'uniform' it is meant that each type of emissive material transferred (where one or more emissive materials are transferred for example in the manufacture of a color cathode ray tube) is sufficiently evenly distributed over the surface of the receptor surface in forming the emissive panel so that upon flood stimulation of the entire surface of the emissive panel, there is no visible pattern of information in the emissions produced. This is a statistically even or uniform distribution of material. For example, when a color CRT screen is deposited, there are three continuous areas of phosphors and a black matrix between each of the continuous areas of phosphors. Looking under a microscope, discrete particles or regions of uniformly distributed individual phosphors could be discerned as the phosphors will vary to some degree in alignment, even though statistically over even small dimensions (e.g., less than 0.1 mm, especially less than 0.05 mm) there will be an even distribution of individual types of particles.

It is highly unexpected that phosphors can be thermally transferred by high energy imaging radiation and retain its high quality phosphorescent emission ability. This is particularly true with the ablative transfer systems of the prior art as represented above with U.S. Pat. No. 5,308,737 and others. Those systems propulsively or explosively transfer materials which would be expected to damage crystals or break up particles during the transfer. It is well known that breaking up or highly stressing phosphors can reduce their efficiency or alter their emission spectra. This would of course be undesirable in the formation of an emissive array.

The present invention also provides a method for using a continuous emissive array on a receptor using the above described thermal transfer element by stimulating only selected areas on the uniformly coated panel. A uniform coating means that the coating is sufficiently evenly distributed over the surface of the receptor surface in forming the emissive panel so that upon flood stimulation of the entire surface of the emissive panel, there is no visible pattern of information in the emissions produced. By visible it is meant upon examination by the naked eye from a distance of no less than 0.5 meters. These coatings contain no information in themselves, but are merely the digitally accessible deposition of the emissive materials. A uniform coating is transferred onto a receptor by (a) placing in intimate contact a receptor and the thermal transfer layer of said thermal transfer element described above, (b) exposing the emissive material thermal transfer element in a uniform pattern of distribution with a radiation source, and (c) transferring the emissive thermal transfer layer corresponding to the uniform pattern to the receptor, to provide a uniformly distributed pattern coating of transferred emissive agent on said support layer. Said uniform patterns are preferably at least 1 square centimeter in area, more preferably at least 2 $cm^2$, still more preferably at least 5 cm² in area when formed in continuous lines. Square areas of these side dimensions are also desired, e.g., 1 square cm, 4 square centimeters, 2.5 square centimeters of continuous areas of phosphor particle distribution. Optionally step (c) may be repeated a sufficient number of times with different emissive thermal transfer donors to provide uniform coatings of multiple emissive agents on said support layer of at least 1 square centimeter. In a color television cathode ray tube, for example, the three or more phosphors may be each evenly distributed over the surface of the screen. Each phosphor is in a uniform (non-information-bearing) coating over the screen surface and the three phosphors together form a uniform, multicolor emitting pattern of phosphor coating. When the thermal transfer layer contains crosslinkable materials, an additional curing step may be performed where the transferred pattern is subsequently crosslinked by exposure to heat or radiation, or treatment with chemical curatives. When the thermal transfer layer contains thermally decomposable materials, a bake-out step may be performed to remove organic residue.

Emissive materials are well known in the art. These are materials which emit radiation when non-thermally stimulated (non-thermal stimulation excluding the fact that all materials, when sufficiently heated, will emit radiation). In the practice of the present invention emissive materials includes materials which are photoluminescent and/or cathodoluminescent and/or electroluminescent. These emissive materials may also absorb (temporarily or for longer time periods, such as days) radiation and, spontaneously or upon passage of time or upon stimulation, emit radiation which measurably differs in wavelength or wavelength band from the absorbed radiation. For example, X-ray intensifying phosphors absorb X-radiation and emit UV, infrared or visible radiation spontaneously (intensifying phosphors) or when subsequently stimulated by a third radiation (storage phosphors). Cathode ray tubes (CRT's) absorb electrons and emit visible radiation. In ELs light is generated by impact excitation of light emitting centers in phosphor materials by high energy (approximately 200 ev) electrons. In color plasma panels a gas discharge emits ultraviolet light which excites a phosphor to produce visible light. FEDs utilize a matrix addressed cold-cathode array in which cathodoluminescent phosphors is an emissive material according to the practice of the present invention.

The phrase "in intimate contact" refers to sufficient contact between two surfaces such that the transfer of materials may be accomplished during the transfer process to provide a sufficient transfer of material within the imaging radiation addressed, thermally stimulated areas. In other words, no voids are present in the transferred areas which would render the transferred image non-functional in its intended application. In the case of cathode ray screens, the black matrix must surround the phosphors, but this is considered functional and continuous within the CRT art. The individual phosphors may not form a sufficiently continuous coating for the purposes of a commercially suitable CRT system, but the three or more phosphors add together to form a functionally continuous coating in the practice of the present invention.

"Imaging energy" refers to absorbed radiation such as that from a flashlamp or laser (or other coherent radiation whether from a laser or solid state emitter such as a laser diode or other source) energy that can cause a unit transfer of an emissive material-containing or phosphor-containing mass transfer layer from an emissive material-containing or phosphor-containing mass transfer donor element to a receptor element.

DETAILED DESCRIPTION OF THE INVENTION

Emissive display devices such as phosphor screens and panels are provided according to the practice of the present invention by the provision of a thermal mass transfer donor element comprising, in order: (a) a support, (b) an optional light-to-heat conversion layer, (c) an optional non-transferable interlayer, (d) a transferable emissive material-containing layer and (e) an optional adhesive layer. One or more of optional layers (b), (c) and (e) may be present on any thermal transfer element used in the practice of the present invention. The process may be generally described as involving the following steps: (i) placing in intimate contact a substrate with the transferable emissive material- (e.g., phosphor-)containing layer (or the transferable layer and overlying adhesive layer) of the thermal transfer element described above, (ii) irradiating one or more of the thermal transfer element or the receptor element (or one or more portions of either, e.g. substrate, transfer layer, light-to-heat conversion layer, an adhesive layer, etc.) with radiation of sufficient intensity to effect local transfer from the thermal mass transfer element, and (iii) thereby transferring the transferable emissive-(e.g., phosphor-)containing layer (and the adhesive layer, if present) in the irradiated areas to the substrate.

The use of radiation and especially coherent radiation to transfer the phosphor or emissive material increases the resolution, registration, and speed of manufacture of the screens as compared to thermal printhead processes, while expanding the scope of substrates which may be used as the receptor with respect to shape (e.g., curved or irregular surfaces), composition and configuration of the receptor.

The transferable emissive material-containing donor element of the present invention can be prepared by providing the layers of a transferable emissive material-containing donor element (i.e., a transferable phosphor-containing layer, and optionally one or more of a light-to-heat conversion layer, an non-transferable interlayer, transferable adhesive layer, etc.) onto a substrate. The donor substrate can be constructed of any material known to be useful as a substrate for a mass transfer donor element. The donor substrate is generally either a rigid sheet material such as glass, ceramics, composites, or a flexible film (e.g., organic polymeric film such as polyester, polycarbonate, etc.). The substrate can be smooth or rough, transparent, opaque, translucent, sheet-like or non-sheet-like. Examples of suitable film substrates include polyesters, especially polyethylene terephthalate (PET), polyethylene naphthalate (PEN), polysulfones, polystyrenes, polycarbonates, polyimides, polyamides, cellulose esters such as cellulose acetate and cellulose butyrate, polyvinyl chlorides and derivatives thereof, and copolymers comprising one or more of the above materials. The polymeric substrate generally has a thickness from 1 to 200 microns, more preferably 2 to 50 microns. Rigid glass or ceramic substrates generally have thickness of from 20 to 1000 microns or more.

The transferable emissive material-containing layer may contain organic binders. The binder can be any of a number of known polymers such as thermoset, thermosettable, or thermoplastic polymers, including acrylates (including methacrylates, blends, mixtures, copolymers, terpolymers, tetrapolymers, oligomers, macromers, etc.), epoxy resins (also including copolymers, blends, mixtures, terpolymers, tetrapolymers, oligomers, macromers, etc.), silanes, siloxanes (with all types of variants thereof), and polymerizable compositions comprising mixtures of these polymerizable active groups (e.g., epoxy-siloxanes, epoxy-silanes, acryloyl-silanes, acryloyl-siloxanes, acryloyl-epoxies, etc.). In one embodiment, the transferable emissive material-containing layer transfer layer contains a thermosettable binder. After the transferable emissie material-containing transfer layer is transferred to the receptor element, the thermosettable binder can be crosslinked, for instance by exposing the thermosettable binder to heat, a suitable radiation source, moisture, or a chemical curative, as is appropriate for the particular thermosettable binder. In some applications it may be desirable to remove the binder from the emissive material containing layer subsequent to transfer to the receptor. In these cases it is desirable to employ binder materials which may be readily removed utilizing, for example heat, radiation and/or chemical etchants.

The transferable emissive- or phosphor-containing donor element can contain ingredients known to be useful with mass transfer donor elements. Dispersants, surfactants and other additives (antioxidants, light stabilizers, brighteners, white pigments, reflective particulates, colorants, coating aids, antistatic agents, etc.) may be included to aid in the dispersion of the emissive materials or impart other desirable properties to transferable emissive material-containing layer as known to those skilled in the art. Especially desirable are the inclusion of fluorinated surfactants and lubricants which facilitate smooth and clean transfer of the emissive material and especially the phosphor layers from the donor to the receptor. The transferable emissive-containing donor element can optionally contain a light absorbing material that absorbs imaging radiation and converts that energy into heat energy. The light absorbing material can be any material that will absorb a portion of incident imaging radiation, converting the radiation energy to heat energy, and thereby facilitating transfer of the transferable emissive-containing layer from the donor element to a receptor element. Examples of materials that can be useful as light absorbing materials include suitable absorbing dyes (i.e., those that absorb light in the ultraviolet, infrared, etc. wavelengths), binders or other polymeric materials, organic or inorganic pigments that can be a black-body or a non-black-body absorber, metals or metal films, or other suitable absorbing materials.

Examples of dyes that have been found to be useful light absorbing materials include dyes absorbing of light in the infrared region of the spectrum. These are described, for example in Matsuoka, M., *Infrared Absorbing Materials*, Plenum Press, New York, 1990, in Matsuoka, M., *Absorption Spectra of Dyes for Diode Lasers*, Bunshin Publishing Co., Tokyo, 1990, in U.S. Pat. Nos. 4,772,583, 4,833,124, 4,912,083, 4,942,141, 4,948,776, 4,948,777, 4,948,778, 4,950,639, 4,940,640, 4,952,552, 5,023,229, 5,024,990, 5,286,604, 5,340,699, 5,401,607 and in European Patent Nos. 321,923 and 568,993. Additional dyes are described in Bello, K. A. et al., *J. Chem. Soc., Chem. Commun.*, 452 (1993) and U.S. Pat. No. 5,360,694. IR absorbers marketed by American Cyanamid or Glendale Protective Technologies under the designation IR-99, IR-126 and IR-165 may also be used, as disclosed in U.S. Pat. No. 5,156,938. In addition to conventional dyes, U.S. Pat. No. 5,351,617 describes the use of IR-absorbing conductive polymers as light absorbing materials.

Other examples of preferred light absorbing materials include organic and inorganic absorbing materials such as carbon black, metals, metal oxides, or metal sulfides, and other known pigments and absorbers. Representative metals include those metallic elements of Groups Ib, IIb, IIIa, IVa, IVb, Va, VIa, VIb and VIII of the Periodic Table, as well as alloys thereof, or alloys thereof with elements of Groups Ia, IIa, and IIIb, or mixtures thereof. Particularly preferred metals include Al, Bi, Sn, In or Zn, and alloys thereof or alloys thereof with elements of Groups Ia, IIa and IIIb of the Periodic Table, or compounds or mixtures thereof. Suitable compounds of these metals include metal oxides and sulfides of Al, Bi, Sn, In, Zn, Ti, Cr, Mo, W, Co, Ir, Ni, Pd, Pt, Cu, Ag, Au, Zr and Te, and mixtures thereof.

The light absorbing material can be added to one or more of the components of the transferable emissive-containing donor element (e.g., the substrate, transferable emissive-containing layer, etc.).

In one embodiment of the present invention, the light absorbing material can be present in the transferable emissive-containing donor element as a separate layer, referred to herein as a "light-to-heat conversion layer" (LTHC). The light-to-heat conversion layer can preferably include one or more layers of organic or inorganic materials that absorb imaging radiation. Preferably, the light-to-heat conversion layer is comprised of materials which are thermally stable. Preferably, the light-to-heat conversion layer remains substantially intact during the imaging process. These light-to-heat conversion layers can be comprised of 100% light absorbing materials; for example if the light-to-heat conversion layer is in the form of a metallic film. Metallic-type light-to-heat conversion layers can preferably have a thickness in the range from about 0.001 to 10 micrometers, more preferably in the range from about 0.002 to 1.0 micrometers.

Alternatively, a light-to-heat conversion layer can comprise particles of light absorbing material (e.g., carbon black) dispersed in a binder. The binder can be any of a number of known film-forming polymers such as thermoset, thermosettable, or thermoplastic polymers, including phenolic resins (e.g., novolak and resole resins), polyvinylacetates, polyvinylidene chlorides, polyacrylates, cellulose ethers and esters, nitrocelluloses, polycarbonates, and mixtures thereof. Preferably, this type of light-to-heat conversion layer is coated to a dried thickness of from 0.05 to 5.0 micrometers, more preferably from 0.1 to 2.0 micrometers.

Adjacent to the optional LTHC layer is coated an optional non-transferable interlayer. Examples of suitable interlayers are described in U.S. Pat. No. 5,725,989 incorporated herein by reference. The incorporation of an interlayer interposed between and light-to-heat conversion layer and the emissive material-containing transferable layer reduces the level of contamination of the resulting transferred image from the light-to-heat conversion layer and decreases the amount of distortion resultant in the transferred image. The interlayer may be either an organic or inorganic material. To minimize damage and contamination of the resultant transferred emissive-containing image, the interlayer preferably is a continuous coating which has a high thermal resistance and remains substantially intact and in contact with the LTHC layer during the imaging process. Suitable organic materials include both thermoset (crosslinked) and thermoplastic materials. The interlayer may be either transmissive or reflective at the imaging radiation wavelength output.

Suitable thermoset resins useful in the interlayer include both thermal- and radiation-crosslinked materials, such as crosslinked poly(meth)acrylates, polyesters, epoxies, polyurethanes, etc. For ease of application, the thermoset materials are usually coated onto the light-to-heat conversion layer as thermoplastic precursors and subsequently crosslinked to form the desired crosslinked interlayer.

Classes of suitable thermoplastic include polysulfones, polyesters, polyimides, etc. and may be applied to the light-to-heat conversion layer using conventional coating techniques (solvent coating, etc.). The optimum thickness of the interlayer is determined by the minimum thickness at which transfer of the light-to-heat conversion layer and distortion of the transferred layer are eliminated, typically between 0.05 µm and 10 µm.

Suitable inorganic materials for use as interlayer materials include metals, metal oxides, metal sulfides, inorganic carbon coatings, etc., which are highly transmissive at the imaging radiation wavelength and may be applied to the light-to-heat-conversion layer using conventional techniques (e.g., vacuum sputtering, vacuum evaporation, plasma jet, etc.). The optimum thickness is determined by the minimum thickness at which transfer of the light-to-heat conversion layer and distortion of the transferred layer are eliminated, typically between 0.01 µm and 10 µm.

Optionally, other non-emissive material-containing transfer layers may be present on the donor to provide additional functionality in the imaging radiation transferred areas. Of particular interest would be to have adhesive materials, and pigments (e.g., red, green and/or blue pigments) in the phosphor matrix or in the surface which adheres to the receptor surface (e.g., curved glass).

Optionally, transferable emissive material-containing donor element may be coated with an adhesive layer which facilitates transfer of the transferable emissive material-containing layer to the receptor.

During imaging radiation exposure it may be desirable to minimize formation of interference patterns due to multiple reflections from the imaged material. This can be accomplished by various methods. The most common method is to effectively roughen the surface of the thermally imageable element on the scale of the incident imaging radiation as described in U.S. Pat. No. 5,089,372. An alternate method is to employ the use of an anti-reflection coating on the second interface that the incident illumination encounters. The use of anti-reflection coatings is well known in the art, and may consist of quarter-wave thickness of a coating such as magnesium fluoride, as described in U.S. Pat. No. 5,171,650. Due to cost and manufacturing constraints, the surface roughening approach is preferred in many applications.

The receptor may be any continuous coating emissive display element benefiting from the application of emissive materials and especially phosphors. The receptor can be smooth or rough, transparent, opaque, translucent, sheet-like or non-sheet like, flat or curved (e.g., as the interior concave surface of a CRT tube). Optionally, the receptor may be coated with an adhesive layer which facilitates transfer of the emissive material containing or phosphor-containing layer to the receptor in the areas exposed to imaging energy. As an alternative to a light absorbing material in the transferable emissive material-containing donor element, for example within the substrate of the receptor element, or within a separate layer of the receptor element (for example, within the black matrix on the substrate, within an adhesive layer of the receptor element, etc.). If the light absorbing material is present in the receptor element, or is a portion of the transferable emissive material-containing donor element that transfers to the receptor element during imaging, it follows that the light absorbing material will be present in the imaged receptor element. In such as case, it is preferred that the light absorbing material not interfere with the performance properties (e.g., the desired optical properties) of the imaged receptor.

The emissive materials may be coated onto the donor substrate by any method which provides sufficient adherence to the substrate to enable it to be used in a thermal imaging process. The emissive material such as a phosphor may be deposited for example by vapor deposition, sol drying, thermal drying, binderless adherence to a receptor coating on the substrate, coating and drying of a dispersion/solution of phosphor particles and binder, coating and drying of a dispersion/solution of organic luminescent material, and the like. A continuous coating requires that there are no physical holes of visually observable dimensions in the coating which render the article non-functional. The transfer of emissive materials in this method provides highly uniform (thickness and orientation), evenly distributed, high resolution distributions of emissive materials in an emissive array. The resolution at least equals that of etched deposited emissive materials and the edges of the phosphor units can be sharper than those provided by etching since undercutting and other etch anomalies are avoided.

In the present invention, emissive materials may be any materials which emit radiation when non-thermally stimulated (non-thermal stimulation excluding the fact that all materials, when sufficiently heated, will emit radiation). In the practice of the present invention preferable emissive materials may be any materials which: 1) absorb electromagnetic radiation and subsequently emit radiation between 200 nm and 1100 nm (photoluminesence) and/or; 2) emit radiation between 200 nm and 1100 nm when impacted by electrons (cathodoluminescence) and/or; 3) emit radiation between 200 nm and 1100 nm when exposed to an electric field (electroluminescence). Emissive materials according to the present invention includes both inorganic emissive materials (for example, phosphors) and organic emissive materials (for example, emissive organic polymers) and combinations thereof. Normally those phosphors are to be provided into the coating compositions used in the practice of the present invention as particulates, particularly with average particle sizes between 0.3 and 50 microns, preferably between 0.5 and 40 microns, more preferably between 0.7 and 35 microns and most preferably between 1 and 30 microns. Amongst the many phosphors known in the art which may be considered in the practice of the present invention are alkali halides, doped alkali halides, rare earth oxy-halides, and others such as are described in U.S. Pat. No. 5,302,423 which is included herein by reference for its disclosure of phosphors. Other literature disclosing phosphors which are contemplated within the scope of the present invention include U.S. Pat. Nos. 4,258,264; 4,261,854; 5,124,564; 4,225,653; 4,387,141; 3,795,814; 3,974,389; 4,405,691, and the like.

Another characteristic of the present invention which distinguishes from previous transfer processes where emissive materials might have been contemplated is in the ability of the present process to uniformly transfer emissive particles of larger size and maintain consistent size distribution as within the original size distribution of the particles within the donor element. This is accomplished by emphasizing the thermal melt stick form of transfer rather than the ablative transfer effected in U.S. Pat. Nos. 5,171,650 and 5,156,938. The ablative form of transfer would not be useful in producing emissive material and especially phosphor screens as the particles are literally broken or blasted into smaller sizes by the ablative process which would not be as controllable or as suitable for emissive panels or screens. It is preferred that the size distribution of particles be maintained in this relatively larger size domain in the creation of phosphor screens, wherein the phosphors are at least 50 number % greater than 4 micrometers (and more preferably greater than 5 micrometers), more preferably at least 60 number percent are greater than 4 micrometers (and again more preferably greater than 5 micrometers), and most preferably at least 75 number percent of the phosphor particles are greater than 4 micrometers (and still more preferably greater than 5 micrometers). It is preferred that the dimensions of the transferred phosphor are less than 150 micrometers in line width and between 0.5 and 50 micrometers in height (thickness). It is more preferred that the line width is less than 100 micrometers and the thickness is between 1 and 10 micrometers. It is most preferred if the line width is between 10 and 90 micrometers and the thickness is between 2 and 5 micrometers.

It is practical in the present invention to produce 'structured' phosphor screens, that is screens with a built-in raster orientation of the phosphor so that stimulation of the screen, when used in a storage phosphor mode, can be effected by an entire surface irradiation rather than by only a point-by-point irradiation by stimulating radiation. This can be accomplished by transferring the desired pattern of phosphor distribution onto the surface of a carrier element, the pattern usually being columns and rows of closely spaced dots, and then hardening the composition of the invention within the pattern. These patterns are not information patterns, but merely accessible arrays of phosphors which lend themselves to stimulation by the stimulating mechanism of choice, e.g., raster scanning along the columns and/or rows.

EXAMPLE

The materials employed below were obtained from Aldrich Chemical Co. (Milwaukee, Wis.) unless otherwise specified.

Laser transfer was accomplished using a single mode, Nd:YAG laser in a flat field scanning configuration. Scanning was performed with a linear galvanometer and was focused onto the image plane using an f-theta scan lens. The power on the image plane was 8 watts, the laser spot size (measured at the $1/e^2$ intensity) was 140×150 microns. The linear laser spot velocity was 4.6 meters/second, measured at the image plane.

The glass receptor substrate was held in a recessed vacuum frame, the donor sheet was placed in contact with the receptor and was held in place via application of a vacuum. Following exposure, the donor is removed.

Phosphor Donor Light-to-Heat Conversion Layer

A carbon black light-to-heat conversion layer was prepared by coating the following "LTHC Coating Solution 1" onto a 3.88 mil PET substrate with a Yasui Seiki Lab Coater, Model CAG-150 using a microgravure roll with 90 helical cells per lineal inch.

| LTHC Coating Solution 1 | |
|---|---|
| Component | Parts by Weight |
| Sunsperse Black LHD-9303 WB4850 (48.6 weight % non-volatiles in water, available from Sun Chemicals, Amelia, OH) | 6.87 |
| Neorad ™ NR-440 (40% nonvolatiles in water, available from Zeneca Resins, Wilmington, MA) | 58.38 |
| Duracure ™ 1173 (2-hydroxy-2 methyl-1-phenyl-1-propanone photoinitiator, available from Ciba-Geigy, Hawthorne, NY) | 1.15 |
| Water | 33.60 |

The coating was in-line dried at 100° C. and UV-cured at 20 feet/minute using a Fusion Systems Model I600 (600 watts/inch) UV curing system fitted with H-bulbs. The cured coating had an optical density of 1.2 at 1064 nm.

Phosphor Donor Interlayer

Onto the carbon black coating of the light-to-heat conversion layer was rotogravure coated "Protective Interlayer Coating Solution 1" using the Yasui Seiki Lab Coater, Model CAG-150 with a microgravure roll with 150 helical cells per lineal inch. This coating was in-line dried (100° C.) and uv-cured at 20 feet/minute using a Fusion Systems Model I600 (600 watts/inch) uv-curing system fitted with H-bulbs. This LITI donor element was denoted was "LITI Donor Element I".

| Protective Interlayer Coating Solution 1 | |
|---|---|
| Component | Parts by Weight |
| Neorad ™ NR-440 | 45.00 |
| Duracure ™ 1173 | 0.90 |
| Water | 54.10 |

Phosphor Donor Transfer Layer

The protective interlayer of LITI Donor Element I was overcoated with "Phosphor Transfer Layer Coating Solution 1" using a #12 coating rod. The coating was then dried for 3 minutes at 60° C.

| Phosphor Transfer Layer Coating Solution 1 | |
|---|---|
| Component | Parts by Weight |
| NP-1056 $Y_2O_3$:Eu red phosphor (available from Nichia America Corporation, Lancaster, PA) | 23.53 |
| Elvacite ™ 2776 (acrylic resin, available from ICI Acrylics, St. Louis, MO) | 5.89 |
| N,N-dimethylethanolamine | 3.53 |
| Water | 67.06 |

The phosphor donor was imaged onto a 5×5 inch 1.1 mm thick glass plate using the laser imaging conditions described above. Phosphor and binder were transferred successfully as a film from the donor to the glass receptor to give lines of approximately 90 $\mu$m width and 3.3 $\mu$m in height, as measured by a profilometer. The phosphor packing appeared to be uniform and dense. Greater than 95% of the area was covered by phosphor particles by visual inspection at 1000X magnification in an optical microscope. The transferred spots were excited with a hand held UV source and were observed to phosphoresce under examination with the naked eye in a darkened room.

What we claim is:

1. A method for patterning an organic electroluminescent material on a substrate, the method comprising the steps of:
    providing a donor sheet having a radiation absorber for absorbing imaging radiation to convert the imaging radiation into heat, and a transfer layer comprising an organic electroluminescent material; and
    selectively irradiating the donor sheet with imaging radiation while the donor sheet is in contact with the substrate to thermally melt transfer portions of the organic electroluminescent material to selected areas of the substrate.

2. The method as recited in claim 1, wherein the radiation absorber is disposed within a light-to-heat conversion layer.

3. The method as recited in claim 2, wherein the donor sheet further comprises an interlayer disposed between the light-to-heat conversion layer and the layer of organic electroluminescent material.

4. The method as recited in claim 3, wherein the interlayer remains substantially intact when the donor sheet is exposed to imaging radiation.

5. The method as recited in claim 1, wherein the organic electroluminescent material comprises a light emitting polymer.

6. The method as recited in claim 1, wherein the organic electroluminescent material comprises an emissive organic molecule.

7. The method as recited in claim 1, wherein the imaging radiation is coherent radiation.

8. The method as recited in claim 1, wherein the substrate comprises glass.

9. The method as recited in claim 1, wherein the substrate comprises plastic.

10. The method as recited in claim 1, further comprising the step of thermally transferring a pigment to the selected areas of the substrate, the pigment being between the substrate and the organic electroluminescent material.

11. The method as recited in claim 1, further comprising the step of coating an adhesion promoting layer between the substrate and the organic electroluminescent material to facilitate transfer of the organic electroluminescent material to the selected areas of the substrate.

12. The method as recited in claim 11, wherein the step of coating the adhesion promoting layer comprises the step of thermally transferring the adhesion promoting layer to the selected areas of the substrate.

13. The method as recited in claim 1, further comprising the steps of:

providing a second donor sheet having a second radiation absorber for converting imaging radiation into heat, and a second transfer layer comprising a second organic electroluminescent material; and selectively irradiating the second donor sheet with imaging radiation while the second donor sheet is in contact with the substrate to thermally melt transfer portions of the second organic electroluminescent material to other selected areas of the substrate.

14. The method as recited in claim 13, wherein the second radiation absorber is disposed within a second light-to-heat conversion layer, and the second donor sheet further comprises a second interlayer disposed between the second light-to-heat conversion layer and the second transfer layer.

15. A display panel comprising a substrate that has a pattern of an organic electroluminescent material disposed thereon, the organic electrolumninescent material patterned on the substrate using the method as recited in claim 1.

16. A donor sheet for patterning organic electroluminescent material on a substrate using the method recited in claim 1, the donor sheet comprising a base layer, a light-to-heat conversion layer disposed between the base layer and the transfer layer, the light-to-heat conversion layer having the radiation absorber disposed therein, and an interlayer disposed between the light-to-heat conversion layer and the transfer layer.

17. A method for patterning an organic electroluminescent polymer material on a substrate, the method comprising the steps of:

providing a donor sheet having a radiation absorber for absorbing imaging radiation to convert the imaging radiation into heat, and a transfer layer comprising an electroluminescent polymer material; and selectively irradiating the donor sheet with imaging radiation while the donor sheet is in contact with the substrate to thermally melt transfer portions of the electroluminescent polymer material to selected areas of the substrate.

18. A thermal melt transfer donor sheet for use in a selective patterning process, the donor sheet comprising:

a base layer;

a radiation absorber capable of absorbing imaging radiation incident on the donor sheet to convert the imaging radiation into heat; and a transfer layer comprising an organic electroluminescent material, the transfer layer being selectively thermal melt transferred from the donor sheet to a receptor when the donor sheet is placed in contact with the receptor and selectively exposed to imaging radiation.

19. The donor sheet as recited in claim 18, wherein the radiation absorber is disposed within a light-to-heat conversion layer positioned between the base layer and the transfer layer.

20. The donor sheet as recited in claim 19, further comprising an interlayer disposed between the light-to-heat conversion layer and the transfer layer.

21. The donor sheet as recited in claim 18, wherein the organic electroluminescent material is a light emitting polymer.

* * * * *

UNITED STATES PATENT AND TRADEMARK OFFICE
CERTIFICATE OF CORRECTION

PATENT NO. : 5,998,085
DATED : December 7, 1999
INVENTOR(S) : Thomas A. Isberg et al.

It is certified that error appears in the above-identified patent and that said Letters Patent is hereby corrected as shown below:

In Column 7, line 44, before the words "is an emmisive material", please insert --are irradiated with electrons and emit visible light. Each of these phosphors --.

In Column 9, line 5, delete "emissie" and insert therefore --emmisive--.

In Column 9, line 67, after "Va", insert --Vb--.

In Column 10, line 24, delete "materials" and insert therefore --material--.

In Column 10, line 47, delete the first occurrence of the word "and" and insert therefore --the--.

In Column 11, line 64, delete "as" and insert therefore --a--.

Signed and Sealed this

Eighteenth Day of July, 2000

Attest:

Attesting Officer

Q. TODD DICKINSON

Director of Patents and Trademarks